(12) United States Patent
Kim

(10) Patent No.: US 10,867,974 B2
(45) Date of Patent: Dec. 15, 2020

(54) SEMICONDUCTOR PACKAGE AND METHOD OF FABRICATING THE SAME

(71) Applicant: SAMSUNG ELECTRONICS CO., LTD., Suwon-si (KR)

(72) Inventor: Sang-Uk Kim, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/249,446

(22) Filed: Jan. 16, 2019

(65) Prior Publication Data
US 2020/0013764 A1    Jan. 9, 2020

(30) Foreign Application Priority Data

Jul. 3, 2018 (KR) .................... 10-2018-0077164

(51) Int. Cl.
  *H01L 25/10* (2006.01)
  *H01L 25/00* (2006.01)
  *H01L 23/498* (2006.01)

(52) U.S. Cl.
  CPC ...... *H01L 25/105* (2013.01); *H01L 23/49816* (2013.01); *H01L 25/50* (2013.01); *H01L 2225/1023* (2013.01); *H01L 2225/1047* (2013.01); *H01L 2225/1082* (2013.01)

(58) Field of Classification Search
  CPC combination set(s) only.
  See application file for complete search history.

(56) References Cited

U.S. PATENT DOCUMENTS

| | | | |
|---|---|---|---|
| 7,989,707 B2 | 8/2011 | Yamano et al. | |
| 7,994,626 B2 | 8/2011 | Pendse | |
| 8,546,932 B1 | 10/2013 | Chung | |
| 8,793,868 B2 | 8/2014 | Yamano et al. | |
| 8,810,024 B2 | 8/2014 | Lin et al. | |
| 8,823,180 B2 | 9/2014 | Wang et al. | |
| 9,343,387 B2 | 5/2016 | Hsu et al. | |
| 9,355,931 B2 * | 5/2016 | Kim ................... H01L 23/36 |
| 9,859,200 B2 | 1/2018 | Park et al. | |
| 2016/0381800 A1 | 12/2016 | Yagnamurthy et al. | |
| 2017/0278830 A1 | 9/2017 | Kim | |

FOREIGN PATENT DOCUMENTS

| | | |
|---|---|---|
| KR | 10-1236483 B1 | 2/2013 |
| KR | 10-1478875 B1 | 1/2015 |
| KR | 10-2017-0005774 A | 1/2017 |
| KR | 10-2017-0113743 A | 10/2017 |

* cited by examiner

*Primary Examiner* — Jasmine J Clark
(74) *Attorney, Agent, or Firm* — Lee IP Law, P.C.

(57) ABSTRACT

Disclosed are semiconductor packages and methods of fabricating the same. The semiconductor package includes a first semiconductor chip on a first substrate, a first molding layer covering a sidewall of the first semiconductor chip and including at least two guide holes that expose the first substrate and are spaced apart from each other in a periphery of the first substrate, a second substrate on the first molding layer, a connection terminal between the first substrate and the second substrates and connecting the first and second substrates to each other, and an alignment structure that extends from a bottom surface of the second substrate into each of the at least two guide holes of the first molding layer. A height of the alignment structure is greater than a height of the first molding layer and the first semiconductor chip.

20 Claims, 13 Drawing Sheets

US 10,867,974 B2

SEMICONDUCTOR PACKAGE AND METHOD OF FABRICATING THE SAME

CROSS-REFERENCE TO RELATED APPLICATION

Korean Patent Application No. 10-2018-0077164, filed on Jul. 3, 2018, in the Korean Intellectual Property Office, and entitled: "Semiconductor Package and Method of Fabricating the Same," is incorporated by reference herein in its entirety.

BACKGROUND

1. Field

Embodiments relate to a semiconductor package and a method of fabricating the same, and more particularly, to a stacked semiconductor package and a method of fabricating the same.

2. Description of the Related Art

In one type of semiconductor package, a semiconductor chip is mounted on a printed circuit board and bonding wires or bumps are used to electrically connect the semiconductor chip to the printed circuit board. In order to realize high integration, numerous stacking methods, e.g., stacking a plurality of semiconductor chips on a single substrate or a package on another package. However, accurate alignment of these elements may be difficult.

SUMMARY

According to some example embodiments, a semiconductor package may comprise: a first semiconductor chip on a first substrate; a first molding layer on the first substrate that covers a sidewall of the first semiconductor chip, the first molding layer including at least two guide holes that expose the first substrate and are spaced apart from each in a periphery of the first substrate; a second substrate on the first molding layer; a connection terminal between the first and second substrates, the connection terminals connecting the first and second substrates to each other; and an alignment structure that extends from a bottom surface of the second substrate into each of the at least two guide holes of the first molding layer. A height of the alignment structure may be greater than a height of the first molding layer and the first semiconductor chip.

According to some example embodiments, a method of fabricating a semiconductor package may include: providing a first package that includes a first semiconductor chip on a first substrate and a first molding layer covering a sidewall of the first semiconductor chip on the first substrate, the first molding layer having a connection hole and a guide hole; providing a lower solder ball in the connection hole, the lower solder ball protruding beyond a top surface of the first molding layer; providing a second substrate on the first package, the second substrate having an upper solder ball and an alignment structure on a bottom surface thereof; inserting the alignment structure into the guide hole; coupling the lower solder ball and the upper solder ball to each other; and forming a connection terminal by combining the lower solder ball and the upper solder ball with each other.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
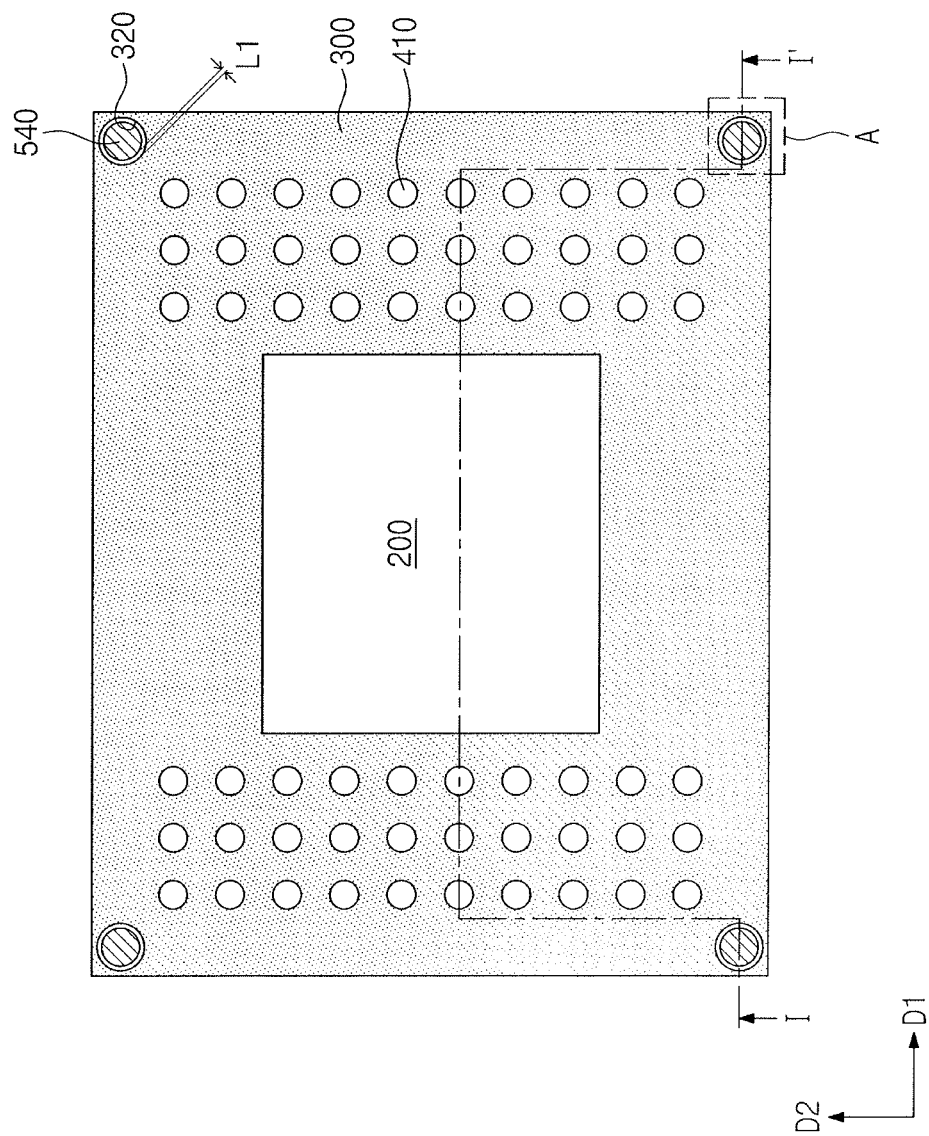
FIG. 1 illustrates a plan view of a first semiconductor package according to some example embodiments.

In this description, like reference numerals may indicate like components. It will now be described a semiconductor package and a method of fabricating the same according to the embodiments.

Figure 3:
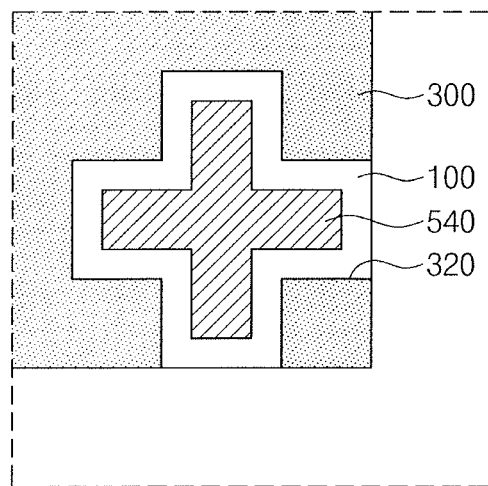
FIGS. 3 and 4 illustrate enlarged views showing section A of FIG. 1.
Figure 4:
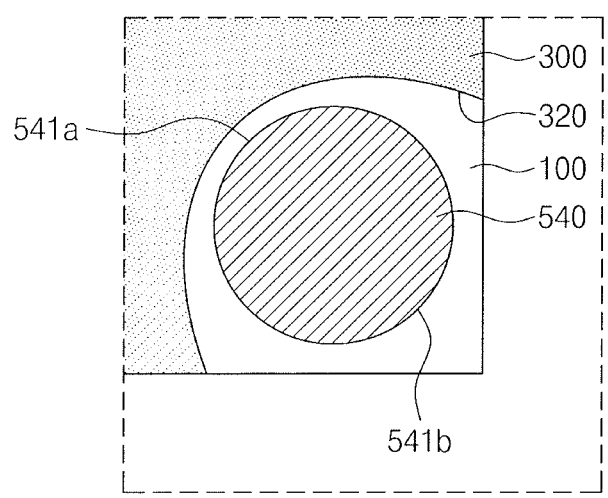
Figure 5:
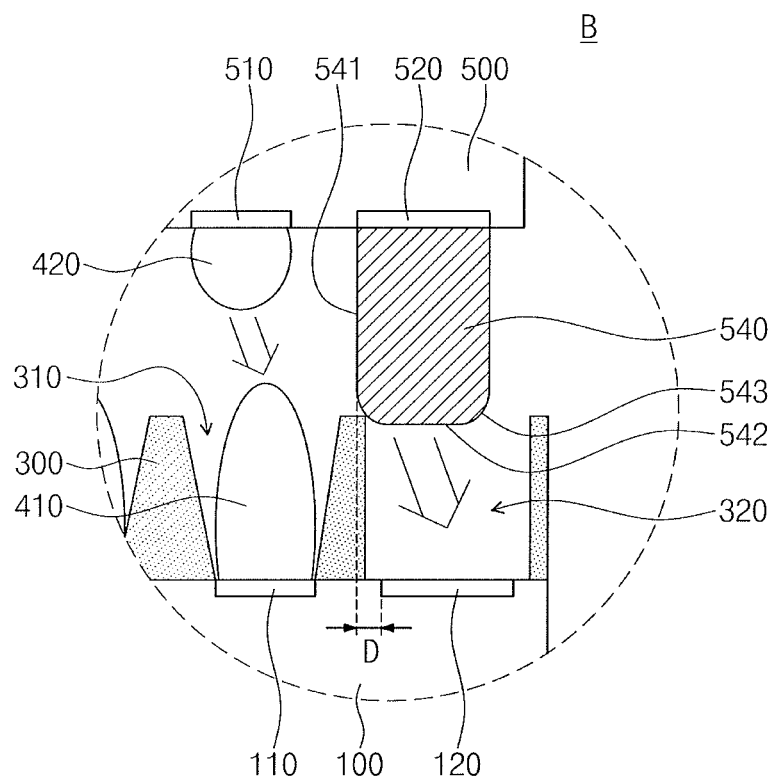
FIG. 5 illustrates an enlarged view showing section B of FIG. 2D.

FIG. 1 illustrates a plan view showing a first semiconductor package according to some example embodiments. FIGS. 2A to 2D illustrate cross-sectional views taken along line I-I' of FIG. 1, showing a first semiconductor package according to some example embodiments. FIGS. 3 and 4 illustrate enlarged views showing section A of FIG. 1. FIG. 5 illustrates an enlarged view showing section B of FIG. 2D.

Figure 2A:
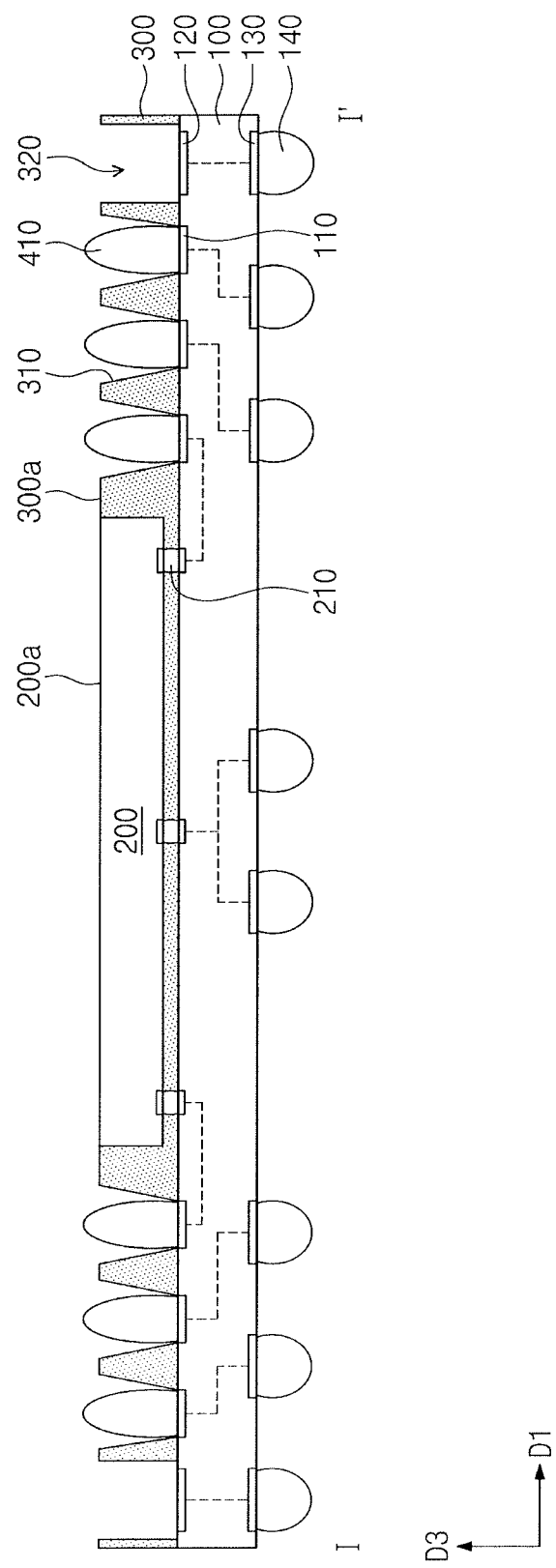
FIGS. 2A to 2H illustrate cross-sectional views of stages in a method of fabricating a first semiconductor package according to some example embodiments.

Referring to FIGS. 1 and 2A, a first substrate 100 may be provided. The first substrate 100 may be a printed circuit board (PCB) having a circuit pattern. The first substrate 100 may include a redistribution layer.

The first substrate 100 may include first pads 110, second pads 120, and third pads 130. The first and second pads 110 and 120 may be spaced apart from one another along a first direction D1 and a second direction D2 on a top surface of the first substrate 100, and the third pads 130 may be spaced apart from the first and second pads 110 and 120 along a third direction D3 on a bottom surface of the first substrate 100. The third pads 130 may be connected either to the first pads 110 or to the second pads 120 through internal connection lines of the first substrate 100. The first substrate 100 has therein dotted lines that schematically show the internal connection lines thereof. The second pads 120 may be electrically connected to a ground circuit provided in the first substrate 100. As may be seen therein, the third pads 130 may overlap, e.g., completely overlap, the second pads 120 along the third direction D3, but may only partially overlap or not overlap the first pads 110 along the third direction D3.

External terminals 140 may be formed on the bottom surface of the first substrate 100. The external terminals 140 may be, e.g., on the third pads 130. The external terminals 140 may be solder balls. The external terminals 140 may include a conductive material.

A first semiconductor chip 200 may be mounted on the first substrate 100. The first semiconductor chip 200 may be coupled through connectors 210 to the first substrate 100. For example, the connectors 210 may be between the first semiconductor chip 200 and the first substrate 100. The connectors 210 may include solder balls, solder bumps, or conductive pillars. The first semiconductor chip 200 may include integrated circuits. The first semiconductor chip 200 may be a logic chip. For example, the first semiconductor chip 200 may act as a non-memory chip, e.g., an application processor.

A first molding layer 300 may be formed on top surface of the first substrate 100. The first molding layer 300 may cover a lateral surface of the first semiconductor chip 200, e.g., may extend from the top surface of the first substrate 100 along sidewalls of the first semiconductor chip 200 and may have a top surface 300a that is coplanar with a top surface 200a of the first semiconductor chip 200. The first molding layer 300 may expose the top surface 200a of the first semiconductor chip 200. The first molding layer 300 may fill a space between the first substrate 100 and the first semiconductor chip 200. For example, the first molding layer 300 may be between a bottom surface of the first semiconductor chip 200 and the top surface of the first substrate 100, enveloping the connectors 210, e.g., fully surrounding sidewalls thereof. The first molding layer 300 may include an epoxy molding compound (EMC).

The first molding layer 300 may include connection holes 310 and guide holes 320. For example, the first molding layer 300 may be partially removed to form the connection holes 310 and the guide holes 320. The partial removal of the first molding layer 300 may be achieved by performing a laser drilling process or an etching process. The connection holes 310 may expose the first pads 110 of the first substrate 100, and the guide holes 320 may expose the second pads 120 of the first substrate 100.

In FIG. 1, each of the guide holes 320 is illustrated as a circular shape. Alternatively, each of the guide holes 320 may have a cross shape as shown in FIG. 3, and may have various shapes (e.g., polygonal shapes, such as a tetragon or a hexagon). Further alternatively, as shown in FIG. 4, each of the guide holes 320 may have a dome-like shape that is opened toward an outer side of the first substrate 100.

In plan view, e.g., the D1-D2 plane, the connection holes 310 and the guide holes 320 may be spaced apart from the first semiconductor chip 200. The connection holes 310 may be spaced apart from the guide holes 320. In plan view, the guide holes 320 may be formed at an outer side of the first substrate 100, and the connection holes 310 may be formed farther away than the guide holes 320 from the outer side of the first substrate 100. For example, the first semiconductor chip 200 may be mounted on a central portion of the first substrate 100, the guide holes 320 may be formed at the outer side of the first substrate 100, and the connection holes 310 may be formed between the first semiconductor chip 200 and the guide holes 320. Ones of the guide holes 320 may be spaced apart from others across the first semiconductor chip 200.

As shown in FIG. 1, the guide holes 320 may be on corner regions of the first substrate 100. The corner region may be defined to refer to a portion of the top surface of the first substrate 100, which portion is adjacent to an edge where lateral surfaces of the first substrate 100 are connected to each other. As shown in FIG. 1, each guide hole 320 may overlap another guide hole 320 along both the first and second directions D1 and D2, and may not overlap any of the connection holes 310 or the first semiconductor chip 200 along the first and second directions D1 and D2. While four guide holes 320 are illustrated, guide holes may be variously arranged in the periphery of the first substrate 100. For example, the four guide holes 320 may form a cross pattern, an additional guide hole 320 may be between each of the four guide holes 320, or only two guide holes may be located at opposite corners.

The connection holes 310 may be provided for receiving a second substrate 500 (see FIG. 2B), as discussed below. The guide holes 320 may be provided to align the second substrate 500 with the first substrate 100.

Lower solder balls 410 may be formed in the connection holes 310. The lower solder balls 410 may be coupled to the first pads 110. The lower solder balls 410 may be electrically connected either to the first semiconductor chip 200 or to the external terminals 140 through the internal circuit of the first substrate 100. The lower solder balls 410 may have their topmost ends at a higher level than that of the top surface 300a of the first molding layer 300 along the third direction D3. The lower solder balls 410 may have their upper lateral surfaces exposed by the first molding layer 300. The lower solder balls 410 may include a conductive material such as tin (Sn), lead (Pb), or silver (Ag). Alternatively, the connection holes 310 may be provided therein with solder pastes instead of the lower solder balls 410.

Figure 2B:
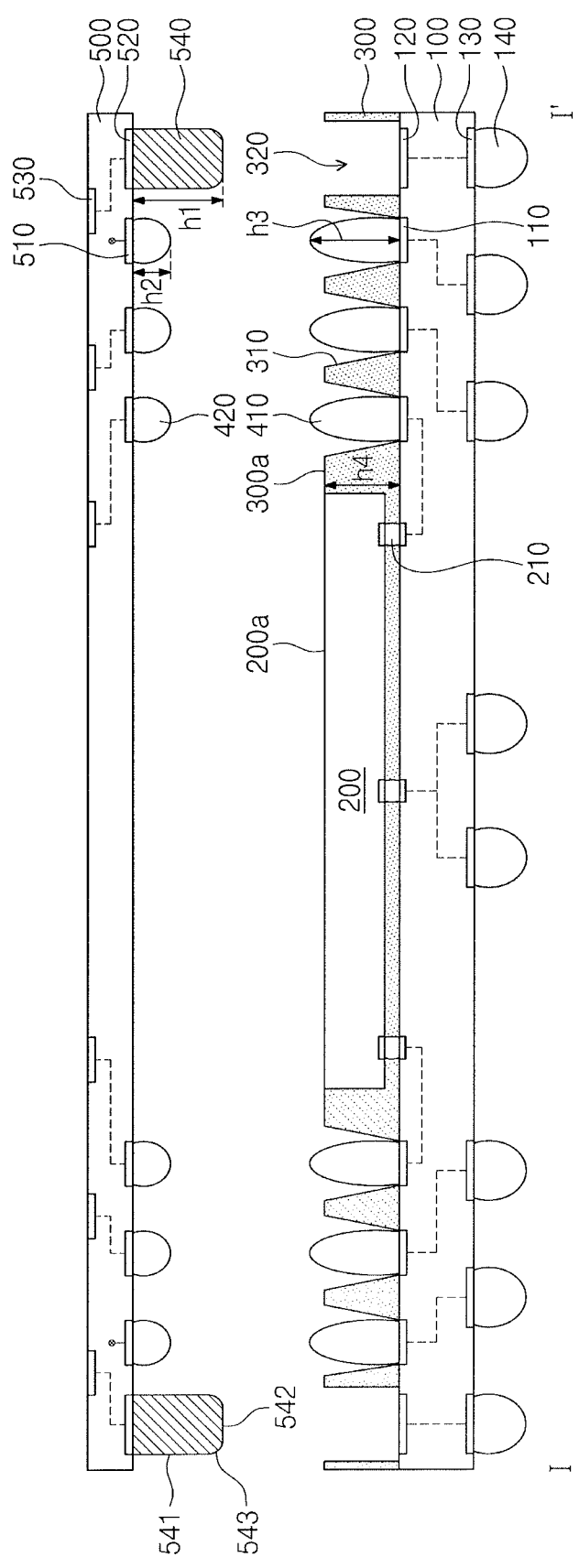

Referring to FIGS. 1 and 2B, the second substrate 500 may be provided on the first substrate 100. The second substrate 500 may have a bottom surface that faces the first semiconductor chip 200. The second substrate 500 may be an interposer substrate. The interposer substrate may include, e.g., a dielectric resin. The dielectric resin may include a solder resist material, e.g., photosensitive polyimide.

The second substrate 500 may include fourth pads 510, fifth pads 520, and sixth pads 530. The fourth and fifth pads 510 and 520 may be on the bottom surface of the second substrate 500, and the sixth pads 530 may be on a top surface of the second substrate 500. The sixth pads 530 may be connected either to the fourth pads 510 or to the fifth pads 520 through internal connection lines of the second substrate 500. The second substrate 500 has therein dotted lines that schematically show the internal connection lines thereof. The fourth pads 510 may be formed at locations that correspond to the first pads 110, and the fifth pads 520 may be formed at locations that correspond to the second pads 120.

Upper solder balls 420 may be on the bottom surface of the second substrate 500. The upper solder balls 420 may be coupled to the fourth pads 510. The upper solder balls 420 may include a conductive material, e.g., Sn, Pb, or Ag. The upper solder balls 420 may differ from the sixth pads 530 in terms of the number or arrangement. For example, in a plan view, the upper solder balls 420 may not overlap the sixth pads 530 along the third direction D3.

The second substrate 500 may include an alignment structure 540. At least two alignment structures 540 may be provided. The alignment structures 540 may be correspondingly coupled to the fifth pads 520 of the second substrate 500. For example, a soldering process or a plating process may be used to couple the alignment structures 540 to the fifth pads 520. The alignment structures 540 may include metal pillars or solder bumps. The alignment structures 540 may include a different material from that of the upper solder balls 420. For example, the material of the alignment structures 540 may have a higher melting point than that of the material of the upper solder balls 420. The following will discuss an example in which the alignment structures 540 include metal pillars.

The alignment structures 540 may be formed on corner regions of the second substrate 500. The alignment structures 540 may be spaced apart from the upper solder balls 420. When viewed in a plan, the alignment structures 540 may be formed at an outer side of the second substrate 500, and the upper solder balls 420 may be formed farther away than the alignment structures 540 from the outer side of the second substrate 500. As shown in FIG. 1, the alignment structures 540 may be on the corner regions of the second substrate 500 to correspond to the guide holes 320.

The alignment structures 540 may have planar shapes identical or similar to those of the guide holes 320. The planar shapes of the alignment structures 540 may have sizes the same as or less than those of the planar shapes of the guide holes 320 and extend along the third direction D3. In FIG. 1, each of the alignment structures 540 is illustrated as a circular shape. Alternatively, each of the alignment structures 540 may have a cross shape, as shown in FIG. 3, or various other shapes (e.g., polygonal shapes such as tetragon or hexagon).

The alignment structures 540 may have their bottommost ends at a lower level than that of bottommost ends of the upper solder balls 420, e.g., may extend along the third direction D3 towards the first substrate 100 further than the upper solder balls 420. Along the third direction D3, each of the alignment structures 540 may have a height h1 greater than a height h2 of the upper solder ball 420 and less than a sum of the height h2 of the upper solder ball 420 and a height h3 of the lower solder ball 410, i.e., before these solder balls are melted. The heights h1 and h2 are measured along the third direction D3 from the bottom surface, i.e., a surface facing the first substrate 100, of the second substrate 500, while the heights h3 and h4 are measured along the third direction D3 from the top surface, i.e., a surface facing the second substrate 500 of the first substrate 100. The height h1 of the alignment structure 540 may be greater than a height h4 of the first molding layer 300 or a height of the first semiconductor chip 200. Because, after the solder balls are melted, the alignment structures 540 are in contact both with the bottom surface of the second substrate 500 and with the top surface of the first substrate 100, the height h1 of each of the alignment structures 540 may be the same as a distance, e.g., may define a distance, between the first and second substrates 100 and 500. In such cases, the top surface 300a of the first molding layer 300 may be spaced apart from the second substrate 500.

The alignment structure 540 may have a rounded bottom end. The alignment structure 540 may have a lateral surface 541, a bottom surface 542, and a corner surface 543. The bottom surface 542 of the alignment structure 540 may be parallel to the top surface of the first substrate 100. The lateral surface 541 of the alignment structure 540 may be perpendicular to the bottom surface 542 of the alignment structure 540. The corner surface 543 of the alignment structure 540 may be a corner section where the lateral surface 541 meets the bottom surface 542. The corner surface 543 of the alignment structure 540 may connect the lateral surface 541 to the bottom surface 542. The corner surface 543 of the alignment structure 540 may be a rounded surface that is curved with a curvature. Alternatively, the corner surface 543 of the alignment structure 540 may be a flat surface. In this case, the corner surface 543 may be an inclined surface relative to the bottom surface 542, e.g., a beveled surface. In other words, the corner surface 543 is not orthogonal to either the lateral surface 541 or the bottom surface 542.

Figure 2C:
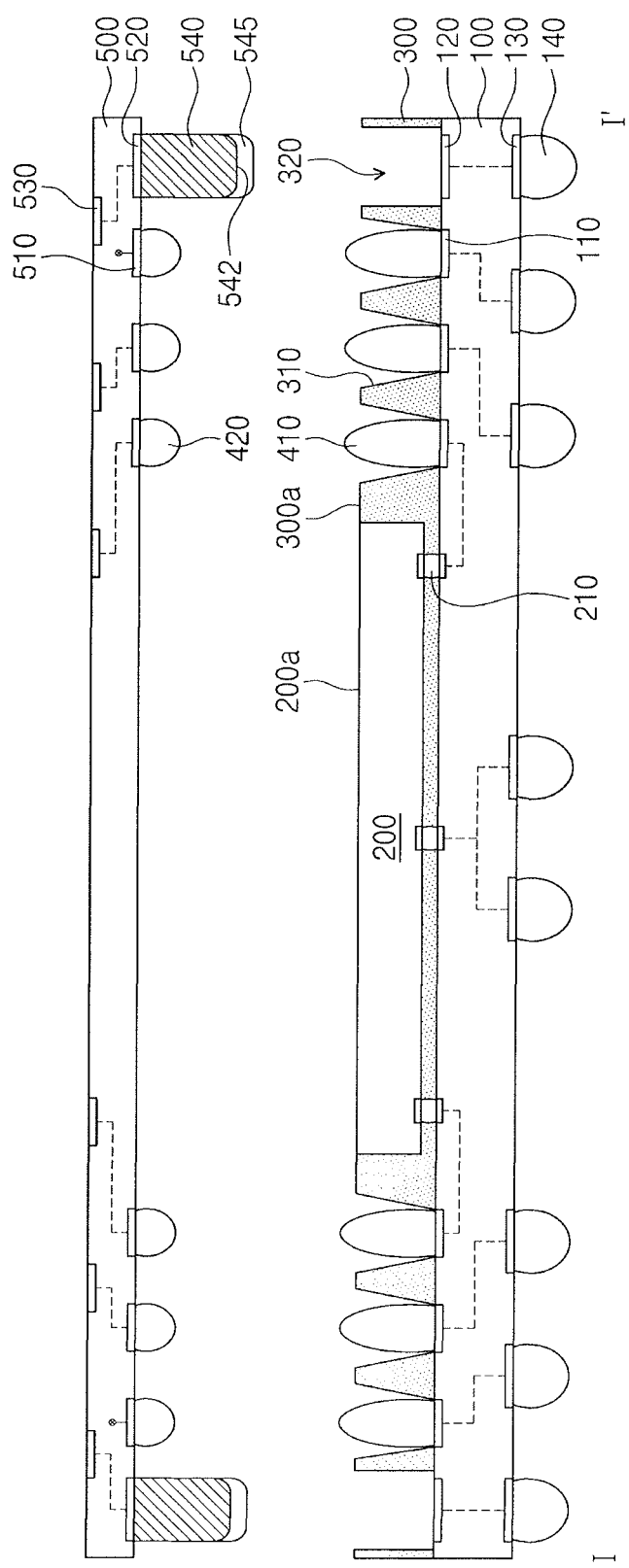

In some example embodiments, as shown in FIG. 2C, an alignment solder cap 545 may be provided on the bottom surface 542 of each of the alignment structures 540. For example, the alignment solder cap 545 may be formed by coating a solder material on the bottom surface 542 of the alignment structure 540. The alignment solder cap 545 may include a different material from those of the lower and upper solder balls 410 and 420. The following will discuss an example shown in FIG. 2B.

Figure 2D:
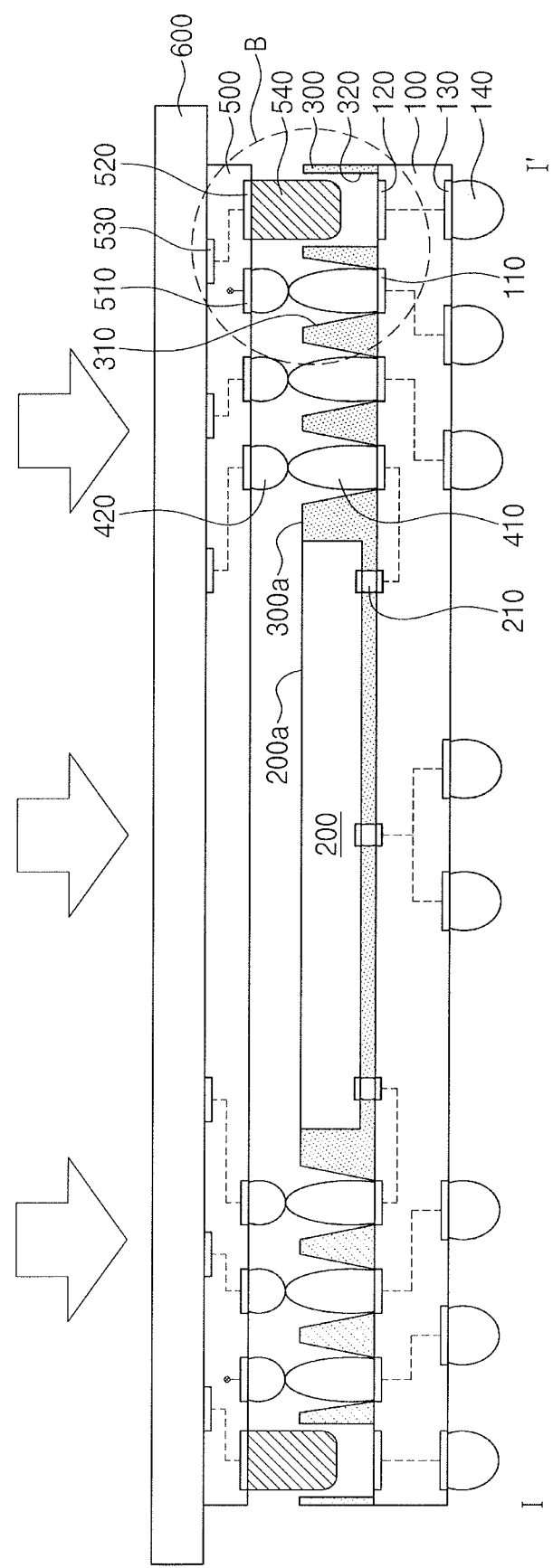

Referring to FIGS. 1 and 2D, the second substrate 500 may be aligned with the first substrate 100 such that the upper solder balls 420 correspond to the lower solder balls 410. A warpage prevention member 600 may be placed on the second substrate 500. For example, a weight may be used as the warpage prevention member 600. The warpage prevention member 600 may extend further in the first and second directions D1 and D2 than the first substrate 100 and the second substrate 500. The second substrate 500 and the first substrate 100 may be brought into contact such that the guide holes 320 receive the alignment structures 540. Because the alignment structures 540 are provided at locations corresponding to the guide holes 320, the first and second substrates 100 and 500 may be aligned with each other when the alignment structures 540 are inserted into the guide holes 320. The mating of the first and second substrates 100 and 500 may be achieved by applying a physical force to the warpage prevention member 600.

Depending on circumstances, the alignment structures 540 may be misaligned with the guide holes 320, and the upper solder balls 420 may then be misaligned with the lower solder balls 410. This misalignment may originate from mechanical errors or other issues of process equipment. FIG. 5 shows an example in which the first and second substrates 100 and 500 have a deviation D due to the misalignment there between. The first and second substrates 100 and 500 may be self-aligned with each other even when the misalignment occurs. For example, the mating of the first and second substrates 100 and 500 may result in the alignment structures 540 contacting a portion of the first molding layer 300, which portion is adjacent to the guide hole 320 (or adjacent to a corner edge of a lateral surface of the guide hole 320).

In this case, because each of the alignment structures 540 has the rounded (or beveled) corner surface 543, the alignment structures 540 may move in a direction indicated by an open arrow shown in FIG. 5. For example, the second substrate 500 may move along the first direction D1 and/or the second direction D2 to cause the alignment structures 540 to be inserted into the guide holes 320. As a result, the first and second substrates 100 and 500 may be aligned with each other. Because the planar shape of the guide hole 320 has a greater size than that of the planar shape of the alignment structure 540, the alignment structures 540 may be easily inserted into the guide holes 320. After the alignment structures 540 are inserted into the guide holes 320, the alignment structures 540 may be spaced apart at a first distance L1 (see FIG. 1) from sides, e.g., inner wall, of the guide holes 320.

Referring back to FIGS. 1 and 2D, the second substrate 500 may continuously extend to couple bottom ends of the upper solder balls 420 to top ends of the lower solder balls 410. The bottommost ends of the alignment structures 540 may be spaced apart from the top surface of the first substrate 100. The upper and lower solder balls 420 and 410 may have rounded shapes. When the second substrate 500 is moving, the upper solder balls 420 may slide on the lower solder balls 410. In this case, the second substrate 500 may horizontally move, e.g., along the first direction D1 and/or the second direction D2, to cause misalignment with the first substrate 100. Because the alignment structures 540 inserted into the guide holes 320 hold the second substrate 500 in its horizontal position, the upper solder balls 420 may not slide on the lower solder balls 410. Accordingly, it may be possible to desirably form connection terminals (see 430 of FIG. 2E) in a subsequent process and to improve reliability of a stacked package.

Figure 2E:
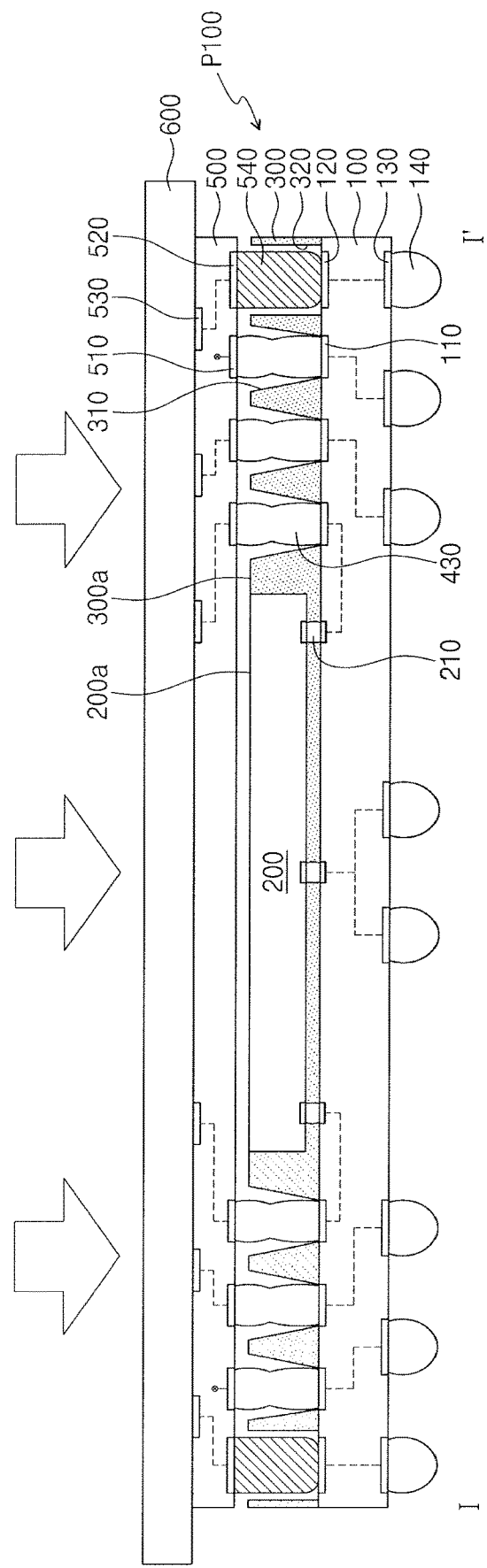

Referring to FIGS. 1 and 2E, the first and second substrates 100 and 500 may undergo a reflow process to form connection terminals 430. The reflow process may be performed at a temperature greater than melting points of the lower and upper solder balls 410 and 420. For example, the reflow process may be performed at a temperature ranging from about 200° C. to about 250° C. The reflow process may be performed at a temperature less than melting points of the first molding layer 300 and the alignment structures 540, i.e., the lower and upper solder balls 410 and 420 have lower melting points than the first molding layer 300 and the alignment structures 540. The lower and upper solder balls 410 and 420 may be reflowed to form the connection terminals 430. The connection terminals 430 may be coupled to the first pads 110 and the fourth pads 510.

When the reflow process is performed, a physical force may be continuously applied to the warpage prevention member 600. As the upper and lower solder balls 420 and 410 are melted, the second substrate 500 may continuously descend. The second substrate 500 may continuously descend until the alignment structures 540 are in contact with the top surface of the first substrate 100. The alignment structures 540 may be coupled and electrically connected to the second pads 120 of the first substrate 100. The alignment structures 540 may be electrically connected through the second pads 120 to the ground circuit of the first substrate 100. Alternatively, the alignment structures 540 may be connected to an electrical circuit provided in the first substrate 100. The alignment structures 540 may not only align but also electrically connect the first and second substrates 100 and 500 with each other, and circuits between the first and second substrates 100 and 500 may be freely designed.

When the connection terminals 430 are cooled down to room temperature (e.g., about 25° C.) after the reflow process, the warpage prevention member 600 may be removed. Through the processes discussed above, a first semiconductor package P100 may be fabricated.

Figure 2F:
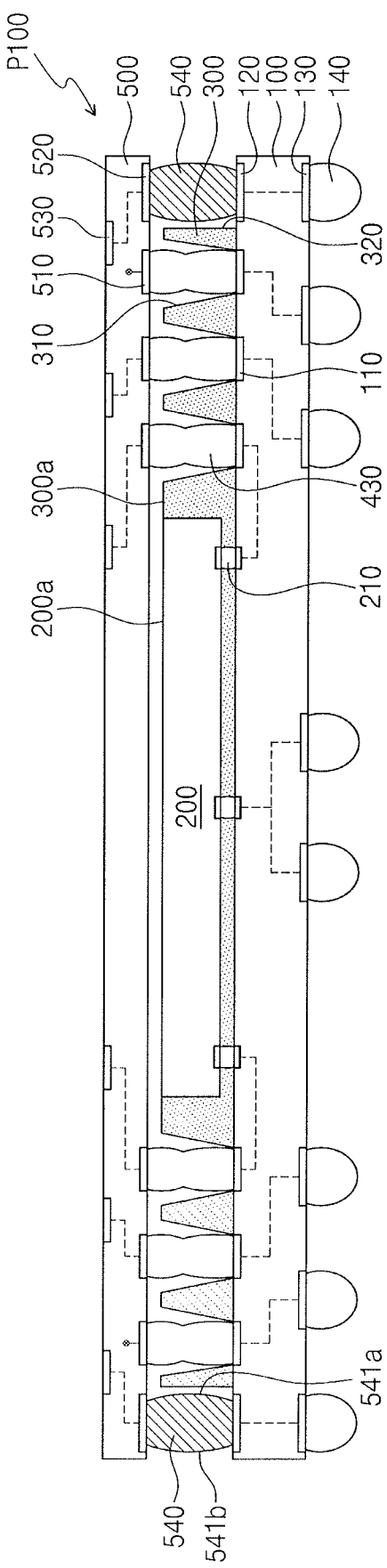

In some example embodiments, when the alignment structures 540 include solder bumps, a process may be additionally performed to couple the alignment structures 540 to the first substrate 100. As shown in FIG. 2F, the connection terminals 430 may be formed after the alignment structures 540 are inserted into the guide holes 320. After that, a laser soldering process may be performed on the alignment structures 540. As shown in FIG. 4, the first molding layer 300 may have a dome-like shape that is opened toward an outer side of the first substrate 100. Each of the alignment structures 540 may have a first lateral surface 541a toward the first semiconductor chip 200 and a second lateral surface 541b opposite to the first lateral surface 541a. A laser soldering process may be performed on the second lateral surface 541b of the alignment structure 540, which is not covered with the first molding layer 300 and, thus, is exposed outside the first substrate 100.

Figure 2G:
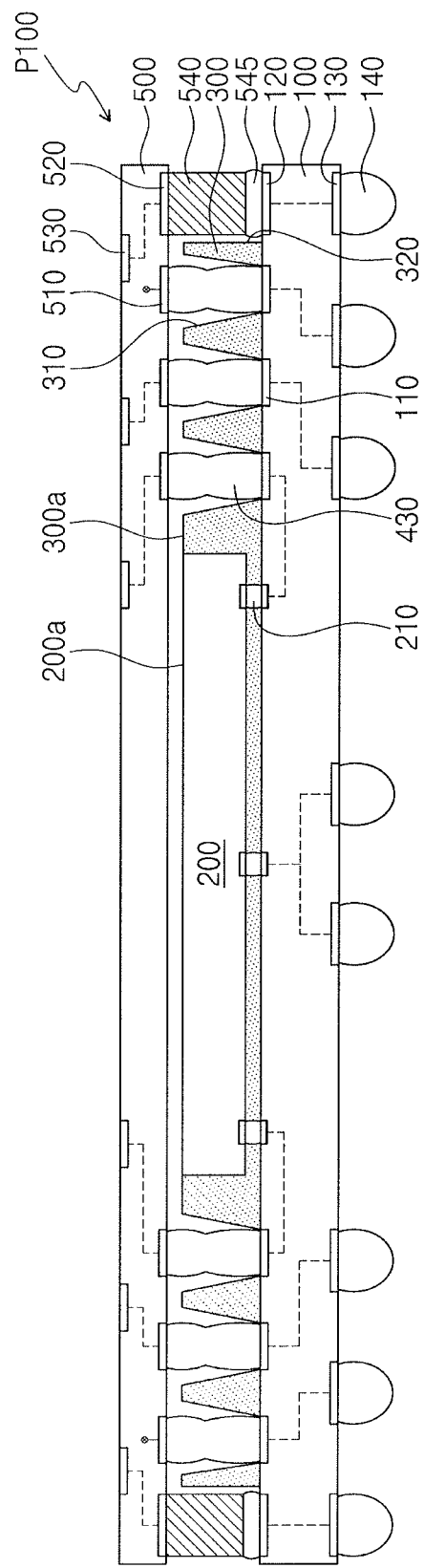

As shown in FIG. 2C, when the alignment structures 540 include the alignment solder caps 545 on their bottom ends, a process may be additionally performed to couple the alignment structures 540 to the first substrate 100. As shown in FIG. 2G, after the alignment structures 540 are inserted into the guide holes 320, the alignment solder caps 545 may also be melted when the soldering process is performed to form the connection terminals 430. When the alignment solder caps 545 are cooled down to room temperature (e.g., about 25° C.) after the reflow process, the alignment solder caps 545 may connect the alignment structures 540 to the second pads 120.

Figure 2H:
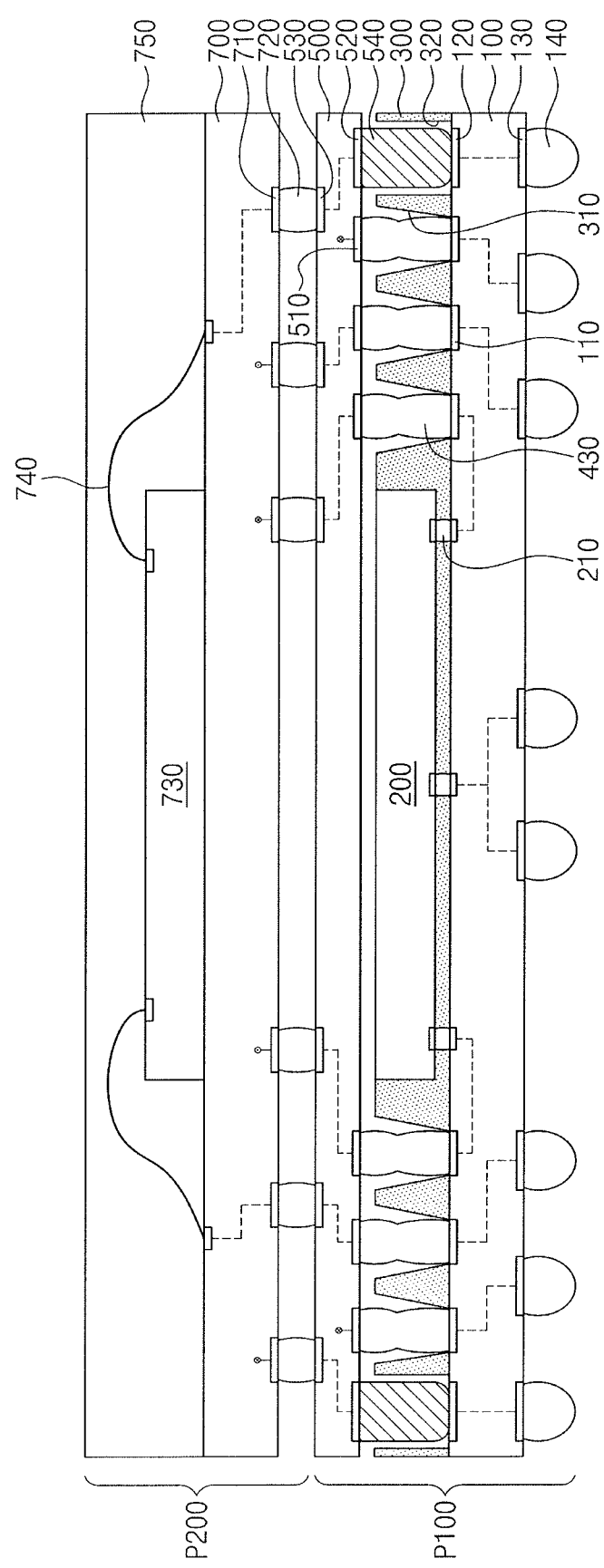

Referring to FIGS. 1 and 2H, a second semiconductor package P200 may be mounted on the first semiconductor package P100 to form a stacked package. The first semiconductor package P100 may be the package fabricated as discussed with reference to FIG. 2E, 2F, or 2G. The second semiconductor package P200 may include a third substrate 700, a second semiconductor chip 730, and a second molding layer 750. The third substrate 700 may include first lower substrate pads 710 on a bottom surface thereof. The second semiconductor chip 730 may be electrically connected through a bonding wire 740 to the third substrate 700. Alternatively, the second semiconductor chip 730 may be flip-chip bonded to the third substrate 700. The second semiconductor chip 730 may be different from the first semiconductor chip 200. The second semiconductor chip 730 may be provided in single or plural. The third substrate 700 may have therein a circuit that is configured depending on mounting manner, kind, size, and/or the number of the second semiconductor chip 730. The second molding layer 750 may be formed on the third substrate 700, covering the second semiconductor chip 730.

The second and third substrates 500 and 700 may be provided there between with coupling terminals 720 that are coupled to the sixth pads 530 and the first lower substrate pads 710. The second substrate 500 may differentiate the coupling terminals 720 from the connection terminals 430 in terms of the number and arrangement. Therefore, the first and the second semiconductor chips 200 and 730 may be variously changed in the number, size, mounting manner, and arrangement. In addition, circuits may be freely designed in the second substrate 500.

Figure 6:
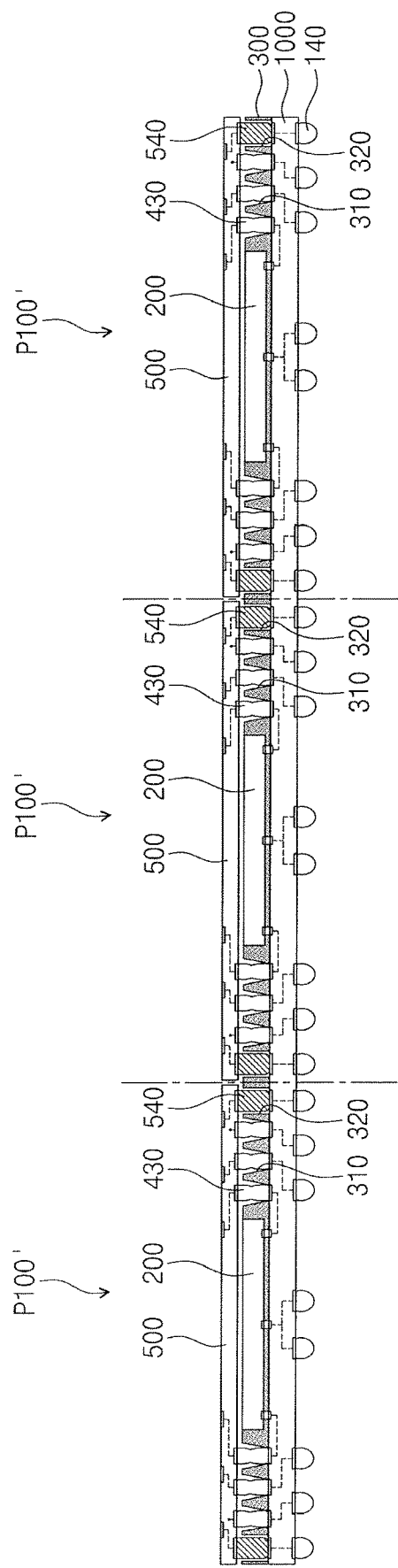
FIG. 6 illustrates a cross-sectional view of a stage in a method of fabricating a first semiconductor package according to some example embodiments.

FIG. 6 illustrates a cross-sectional view showing a stage in a method of fabricating a first semiconductor package according to some example embodiments. For convenience of description, the following will explain differences from those discussed with reference to FIGS. 1 and 2A to 2H.

Referring to FIG. 6, the first semiconductor chip 200 may be provided in plural. The first semiconductor chips 200 may be provided on a first wafer 1000. The first wafer 1000 may be a strip printed circuit board. The first molding layer 300 may be formed on the first wafer 1000, covering the first semiconductor chips 200. The first molding layer 300 may be substantially the same as the first molding layer 300 discussed with reference to FIG. 2A. For example, the first molding layer 300 may have connection holes 310 and guide holes 320.

The second substrate 500 may be provided in plural, e.g., may be individually aligned to each first semiconductor chip. Each of the second substrates 500 may be substantially the same as the second substrate 500 of FIG. 2B. For example, each of the second substrates 500 may have alignment structures 540 on a bottom surface thereof. The second substrates 500 may be provided on corresponding first semiconductor chips 200. The alignment structures 540 of the second substrates 500 may be aligned with corresponding guide holes 320 of the first molding layer 300. A reflow process may form connection terminals 430 between the first wafer 1000 and the second wafer 5000. After that, depending on circumstances, an under-fill layer may be formed between the first molding layer 300 and the second substrates 500, and between the first semiconductor chips 200 and the second substrates 500.

The first wafer 1000, the first molding layer 300, and the under-fill layer may be diced along dotted lines, with the result that a plurality of first semiconductor packages P100' may be formed separated from each other. Each of the first semiconductor packages P100' may be substantially the same as the first semiconductor package P100 of FIG. 2E.

Figure 7:
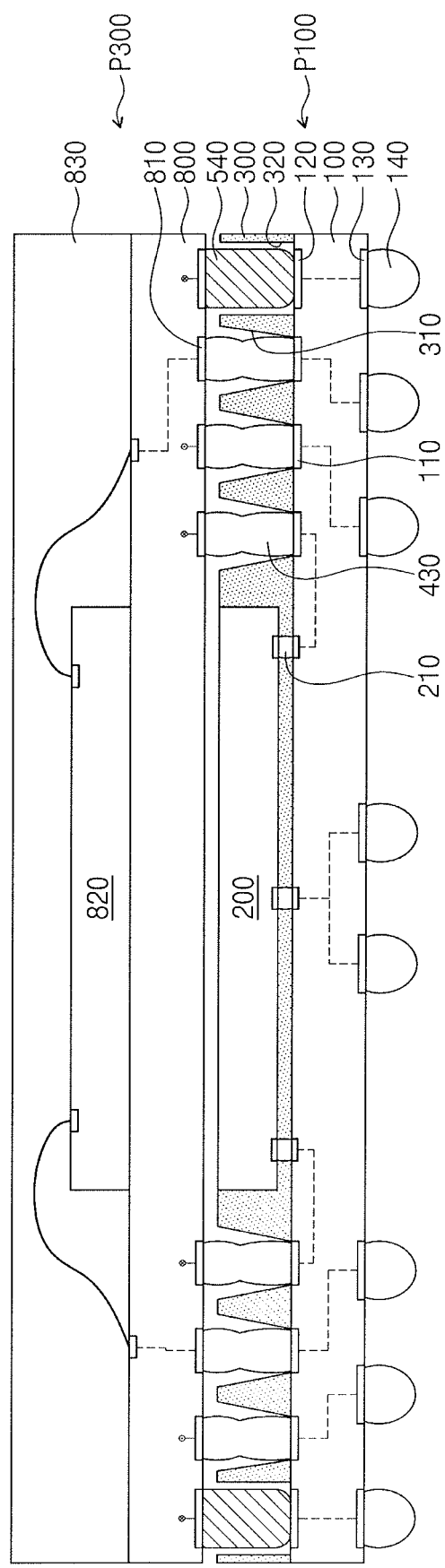
FIG. 7 illustrates a cross-sectional view of a stacked package according to some example embodiments.

FIG. 7 illustrates a cross-sectional view showing a stacked package according to some example embodiments.

Referring to FIG. 7, a stacked package may include the first semiconductor package P100 and a third semiconductor package P300. The third semiconductor package P300 may be mounted on the first semiconductor package P100.

The first semiconductor package P100 may include a first substrate 100, a first semiconductor chip 200, and a first molding layer 300. The third semiconductor package P300 may include a fourth substrate 800, a third semiconductor chip 820, and a third molding layer 830. The first substrate 100, the first semiconductor chip 200, and the first molding layer 300 may be substantially the same as those discussed with reference to FIG. 2E. In contrast, the second substrate 500 may be omitted, and the fourth substrate 800 may include alignment structures 540 on a bottom surface thereof. In plan view, the alignment structures 540 may overlap guide holes 320 of the first molding layer 300. The alignment structures 540 may extend from the bottom surface of the fourth substrate 800 into the guide holes 320 of the first molding layer 300, and may be coupled to second pads 120 of the first substrate 100.

The first substrate 100 may include connection terminals 430 in connection holes 310 of the first molding layer 300. The connection terminals 430 may be coupled to first pads 110 of the first substrate 100 and second lower substrate pads 810 of the fourth substrate 800. The alignment structures 540 may prevent the third semiconductor package P300 from shifting when a reflow process is performed to form the connection terminals 430. Therefore, it may be possible to desirably form the connection terminals 430 and to improve reliability of the stacked package.

According to some example embodiments, a semiconductor package may use an alignment structure to reduce misalignment that may occur when a second substrate is provided on a first substrate. Furthermore, when a reflow process is performed to mount the second substrate on the first substrate, the alignment structure may prevent the second substrate from being shifted relative to the first substrate. Accordingly, the first and second substrates may be successfully aligned with each other, and appropriate electrical connections may be realized. As a result, the semiconductor package may improve in reliability.

In addition, the alignment structure may be used not only to align the first and second substrates with each other, but to connect the second substrate to a ground or electrical circuit of the first substrate. Thus, the alignment structure may electrically connect the first and second substrates to each other, and circuits may be freely designed between the first and second substrates.

Some example embodiments may provide a semiconductor package with improved structural stability and a method of fabricating the same. Some example embodiments may provide a semiconductor package with enhanced reliability and a method of fabricating the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
    a first semiconductor chip on a first substrate;
    a first molding layer on the first substrate that covers a sidewall of the first semiconductor chip, the first molding layer including at least two guide holes that expose the first substrate and are spaced apart from each in a periphery of the first substrate;
    a second substrate on the first molding layer;
    a connection terminal between the first substrate and the second substrate, the connection terminals connecting the first substrate and the second substrate to each other; and
    an alignment structure that extends from a bottom surface of the second substrate into each of the at least two guide holes of the first molding layer,
    wherein a height of the alignment structure is greater than a height of the first molding layer and the first semiconductor chip.

2. The semiconductor package as claimed in claim 1, wherein the at least two alignment holes are in corner regions of the first substrate, as viewed in plan view.

3. The semiconductor package as claimed in claim 1, wherein the alignment structure contacts the first substrate.

4. The semiconductor package as claimed in claim 3, wherein the alignment structure is connected to a ground circuit of the first substrate.

5. The semiconductor package as claimed in claim 1, wherein:
    the alignment structure has a lateral surface, a bottom surface, and a corner surface that connects the lateral surface and the bottom surface to each other, and
    the corner surface is a rounded or beveled surface.

6. The semiconductor package as claimed in claim 1, wherein a planar shape of the alignment structure is a circular shape, a polygonal shape, or a cross shape.

7. The semiconductor package as claimed in claim 1, wherein the alignment structure is spaced apart from an inner wall of a corresponding guide hole of the at least two guide holes.

8. The semiconductor package as claimed in claim 1, wherein the alignment structure includes a conductive pillar or a solder bump.

9. The semiconductor package as claimed in claim 1, further comprising a solder cap on a bottom end of the alignment structure that connects the alignment structure and the first substrate to each other.

10. The semiconductor package as claimed in claim 1, wherein:
    the alignment structure has a first lateral surface facing the first semiconductor chip and a second lateral surface opposite to the first lateral surface, and
    the first molding layer exposes the second lateral surface of the alignment structure.

11. The semiconductor package as claimed in claim 1, further comprising electrical connections between the first and second substrates, wherein a material of the electrical connections has a lower melting point than that of the alignment structure and the first molding layer.

12. A method of fabricating a semiconductor package, the method comprising:
    providing a first package that includes a first semiconductor chip on a first substrate and a first molding layer covering a sidewall of the first semiconductor chip on the first substrate, the first molding layer having a connection hole and a guide hole;

providing a lower solder ball in the connection hole, the lower solder ball protruding beyond a top surface of the first molding layer;

providing a second substrate on the first package, the second substrate having an upper solder ball and an alignment structure on a bottom surface of the second substrate;

inserting the alignment structure into the guide hole; and combining the lower solder ball and the upper solder ball to form a connection terminal connecting the second substrate to the connection hole in the first substrate.

13. The method as claimed in claim 12, wherein a material of the upper solder ball and the lower solder ball has a lower melting point than that of the alignment structure and the first molding layer.

14. The method as claimed in claim 12, wherein a bottommost end of the alignment structure is located at a lower level than that of a bottommost end of the upper solder ball.

15. The method as claimed in claim 14, wherein a height of the alignment structure is greater than a height of the upper solder ball, less than a sum of the height of the upper solder ball and a height of the lower solder ball, and greater than a height of the first semiconductor chip.

16. The method as claimed in claim 12, wherein:
the alignment structure has a lateral surface, a bottom surface, and a corner surface that connects the lateral surface and the bottom surface to each other, and
the corner surface is a rounded or beveled surface.

17. The method as claimed in claim 12, wherein upper lateral surfaces of the lower solder ball are exposed by the first molding layer.

18. The method as claimed in claim 12, wherein, after forming the connection terminal, further comprising coupling the alignment structure to the first substrate.

19. The method as claimed in claim 12, wherein:
the alignment structure includes an alignment solder cap on a bottom end thereof, and
forming the connection terminal includes using the alignment solder cap to connect the alignment structure and the first substrate to each other.

20. The method as claimed in claim 12, wherein the guide hole exposes a corner region of the first substrate, as viewed in plan view.

* * * * *